United States Patent
McNamara et al.

(10) Patent No.: US 6,487,704 B1
(45) Date of Patent: Nov. 26, 2002

(54) SYSTEM AND METHOD FOR IDENTIFYING FINITE STATE MACHINES AND VERIFYING CIRCUIT DESIGNS

(75) Inventors: Michael McNamara, Santa Clara, CA (US); Chong Guan Tan, Saratoga, CA (US); Chiahon Chien, Saratoga, CA (US); David Todd Massey, Boulder Creek, CA (US)

(73) Assignee: Verisity Design, Inc., Mountain View, CA (US)

( * ) Notice: Subject to any disclaimer, the term of this patent is extended or adjusted under 35 U.S.C. 154(b) by 0 days.

(21) Appl. No.: 09/076,681

(22) Filed: May 12, 1998

Related U.S. Application Data

(63) Continuation-in-part of application No. 08/908,248, filed on Aug. 7, 1997, now Pat. No. 6,141,630.

(51) Int. Cl.[7] .............................................. G06F 17/50
(52) U.S. Cl. .............................................. 716/5; 716/4
(58) Field of Search ........................ 716/5, 4; 703/13, 703/14

(56) References Cited

U.S. PATENT DOCUMENTS

| | | | |
|---|---|---|---|
| 5,469,443 A | * 11/1995 | Saxena | 714/720 |
| 5,517,432 A | * 5/1996 | Chandra et al. | 703/14 |
| 5,528,553 A | * 6/1996 | Saxena | 365/230.01 |
| 5,539,680 A | * 7/1996 | Palnitkar et al. | 703/13 |
| 5,555,270 A | 9/1996 | Sun et al. | 714/738 |
| 5,659,555 A | 8/1997 | Lee et al. | 714/738 |
| 5,680,332 A | 10/1997 | Raimi et al. | 703/13 |
| 6,041,429 A | * 3/2000 | Koenemann | 714/738 |
| 6,141,630 A | * 10/2000 | McNamara et al. | 703/14 |

* cited by examiner

Primary Examiner—Vuthe Siek
(74) Attorney, Agent, or Firm—Michael A. Glenn; Kirk D. Wong

(57) ABSTRACT

To identify a finite state machine and verify a circuit design, the invention identifies, in a design description, a set of constructs, a construct in the set of constructs, and an object in the construct. It next identifies a first subset of constructs in the set of constructs which can control a change of a value of the object, and then identifies a second subset of constructs whose values can be changed directly or indirectly by the object. The identifying and storing steps are repeated for all objects in the construct and for all constructs in the set of constructs. A finite state machine is identified by searching for a first object which controls a change of a value of a second object and whose value is also changed directly or indirectly by the second object. This method of identifying finite state machine elements in a design description is used by a test generator which then generates test vectors for exercising the finite state machine elements on a test bench.

31 Claims, 7 Drawing Sheets

SYSTEM AND METHOD FOR IDENTIFYING FINITE STATE MACHINES AND VERIFYING CIRCUIT DESIGNS

This application is a Continuation In Part from application Ser. No 08/908,248, entitled "SYSTEM AND METHOD FOR AUTOMATED DESIGN VERIFICATION", filed Aug. 7, 1997 and issued as U.S. Pat. No. 6,141,630 on Oct. 31, 2000.

BACKGROUND OF THE INVENTION

1. Technical Field

This invention relates generally to automatically testing circuit design descriptions generated in an Electronic Design Automation (EDA) environment, and more particularly to identifying finite state machines and verifying circuit designs in a Verilog or VHDL environment.

2. Background Art

Electronic Design Automation (EDA) is a process for using computer programs to design, simulate, and test electronic circuits before fabricating them in silicon. Verilog and VHDL are two languages commonly used to define circuits in the steps of design, simulation, and testing. Circuit designs are tested with the aid of various simulation/emulation software packages so that design flaws can be detected and corrected before any actual devices are fabricated. Testing a circuit design before it is fabricated saves design firms millions of dollars in non-recoverable engineering (NRE) costs; however, as the circuit design complexity increases, so too does the difficulty of testing. Since system designers are asked to design and test these increasingly complex circuits in ever smaller time frames, designers must choose between either taking more time to test the design, and thereby delaying product shipment, or only testing portions of the circuit, and thereby increasing the risk that many undiscovered bugs remain in the design.

Various simulation and test products on the market attempt to increase the efficiency of circuit design verification. One approach speeds up the design simulation programs. Native Code Simulators, Simulation Acceleration, and Chip Emulation Systems decrease the time it takes to simulate a design, and may decrease the time it takes to identify the next bug in a design. However, during early stages of the design process, design bugs are prevalent, and speeding up the simulation does little to help identify the bugs.

Another approach tests the circuit design randomly. Random testing involves generating randomly related unique test vectors and testing (or "exercising") the design with these vectors. In this approach, as time allotted for random testing increases, more of the circuit design is tested. Random testing is time consuming and risky, since discovering bugs is hit or miss, and there usually is not sufficient time to fully test the circuit design. Running a random simulation ten or one hundred times longer may not significantly increase the verification density.

Other types of EDA testing tools, such as Automatic Test Pattern Generation (ATPG) tools, produce tests which only identify manufacturing defects in already-fabricated circuits. Testing is performed by successively applying known input values to the pins of the circuit, and then comparing actual output values with sets of expected output values. However, ATPG tools assume that the circuit design is fundamentally correct and that any anomalies discovered are due to physical defects such as wire breaks, introduced during manufacturing.

Other EDA testing tools, such as Verilint, developed by InterHDL of Los Altos, Calif.; Vericov, developed by Simulation Technology of Saint Paul, Minn.; Vera, developed by System Science of Palo Alto, Calif.; and Specman, developed by Verisity of Yehud, Israel are difficult to use, sell, and integrate into a test bench for verifying circuit designs.

Many circuit designs also include Finite State Machines (FSMs) which are complex and often a source of bugs. Thus, circuit designers are particularly interested in exercising the full range of behavior of an FSM as early in the testing process as possible. Existing test tools require designers to manually identify and define each of the states and transitions present in each FSM in the circuit before testing can commence.

What is needed is a system and method for identifying finite state machines and verifying circuit designs that increases the efficiency of circuit design testing.

SUMMARY OF THE INVENTION

The present invention provides a method and a system for identifying finite state machines and verifying circuit designs. The invention automatically identifies and tests input, output, and internal variables, finite state machines (FSMs), transitions elements, blocks, arcs, and paths of interest elements in a design description of a circuit.

The process of identifying elements first identifies a set of constructs in the design description. Next, a construct in the set of constructs and an object in the construct are identified. A first subset of constructs in the set of constructs, which can change, or control a change of a value of the object, are then identified. A second sub set of constructs in the set of constructs, whose values can be changed directly or indirectly by the object, are also identified. The identified construct, object, and first and second subsets of constructs are then stored in a relational database. The identifying and storing steps are then repeated for all objects in the construct and for all constructs in the set of constructs.

A finite state machine in the design description is identified by searching the relational database for a first object which controls changes of a value of a second object and whose value is also changed directly or indirectly by the second object. The first object is identified as an FSM state variable, if an occurrence of the first object precedes an occurrence of the second object. The second object is identified as an FSM state variable, if an occurrence of the second object precedes an occurrence of the first object. FSM state transition elements are identified as transitions from a first allowable state to a second allowable state in a set of allowable states of the FSM state variable.

Systems using the invention store a design description in a design database. A test generator identifies any finite state machine elements in the design description. Based on the design description retrieved from the design database a test bench then generates a simulated design. A coverage analysis tool monitors output data from the simulated design executing on the test bench and identifies which elements of the design remain to be tested. The test generator then generates test vectors, which are sent to the test bench, for exercising the untested elements.

Compared to the prior art the invention is advantageous because it automates a critical part of design verification which has been performed manually and sporadically due to time and resource requirements. The invention permits testing of input, output, and internal variables, finite state machines, transitions elements, blocks, arcs, and paths of interest elements in a design description, quickly, easily and comprehensively, in an integrated process. As a result, designers can proceed toward fabrication with confidence that the simulated design has been verified. A time savings of months is achieved, since any design flaws are discovered before the simulated design is fabricated.

These and other aspects of the invention will be recognized by those skilled in the art upon review of the accompanying drawings, detailed description and claims.

DETAILED DESCRIPTION OF THE PREFERRED EMBODIMENT

Figure 1:
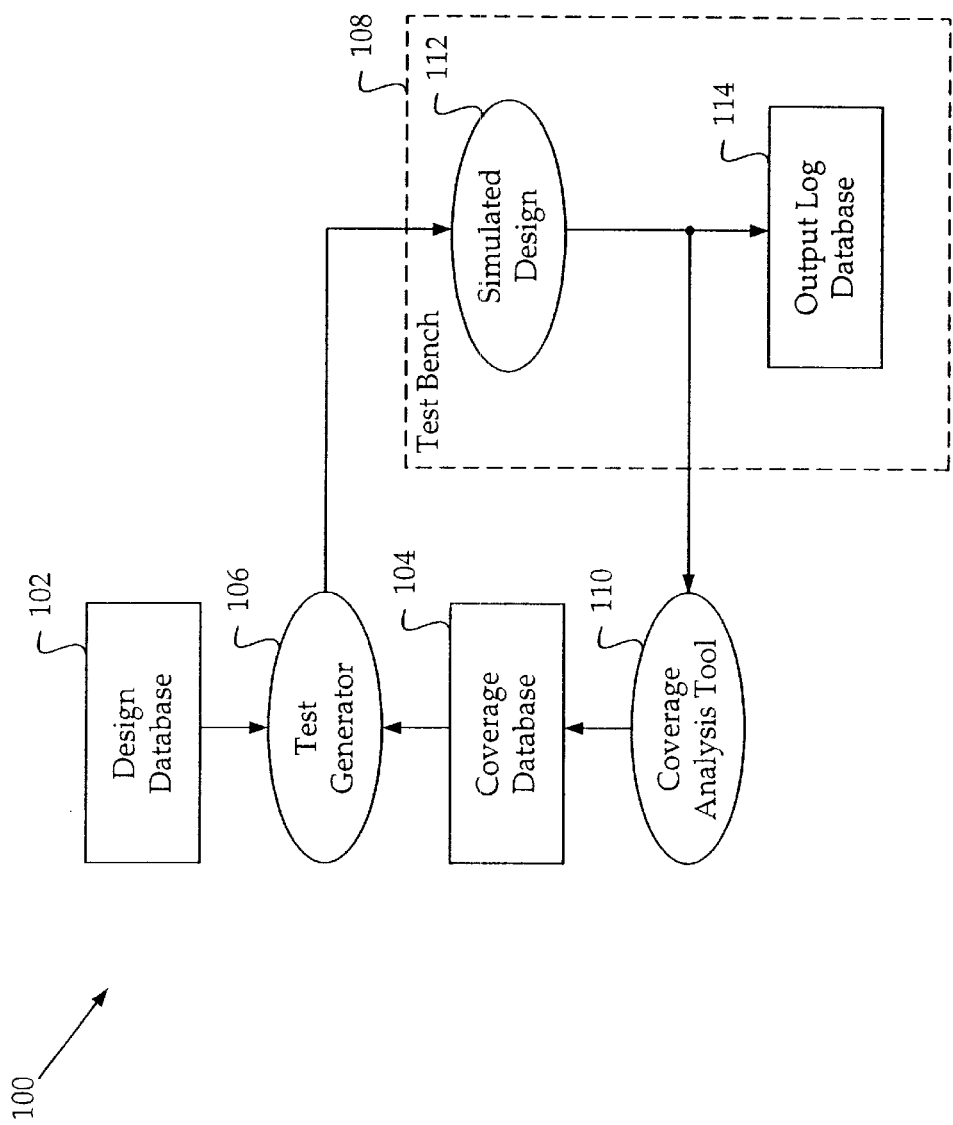
FIG. 1 is a data-flow diagram of a first embodiment of the invention for identifying finite state machines and verifying circuit designs.

FIG. 1 is a data-flow diagram of a first exemplary system 100 for identifying Finite State Machines (FSMs) and verifying circuit designs according to the present invention.

System 100 includes a design database 102, a coverage database 104, a test generator 106, a test bench 108, and a coverage analysis tool 110. The test bench 108 includes a simulated design 112 and an output log-database 114. The design database 102 contains one or more circuit designs typically coded in a design language such as Verilog, VHDL or C++ of the kind used also with other Electronic Design Automation (EDA) tools to simulate, test, and fabricate circuit designs.

Before testing is commenced, all FSMs in the circuit design are identified. FSMs may be classified as either synchronous or asynchronous. Synchronous FSMs transition between states in response to a clock signal; asynchronous FSMs transition between states in response to interrupt events.

FSMs may also be coded in a variety of convention styles. Structural styles define the circuit design in terms of controlled storage elements such as flip flops or latches. The control logic in the structural style is described as interconnected primitive logic gates such as AND, OR, XOR and NOT, and/or simple continuous assignment statements using logic operators like AND, OR, NOT, XOR, and QCA. While a structural representation of an FSM may be more complex, such a representation more specifically describes an exact implementation of logic in the FSM.

RTL styles define the circuit design in terms of more abstract, higher level descriptions. Storage elements are specified using flip-flops, latches, or high level process descriptions. Control logic is described by a high level process description, using case statements or if-then-else statements. RTL representations of an FSM are typically easier for users to comprehend, and for designers to modify. RTL representations, however, rely on synthesis tools for actual circuit implementation. Since synthesis tools have more degrees of freedom in gate choice, the resulting circuit designs may not be optimally implemented. The FIGS. 5, 6 and 7 flowcharts give details of how the FSMs are identified in the design.

The coverage database 104 contains a record of which areas of the circuit design have already been tested (i.e. "covered"). Coverage database 104 maps all of the blocks, arcs, FSM states, and FSM transitions in the design.

A block is a section of code where, if a first construct in the code is executed, then a subsequent set of constructs in the code will also be executed. The executed constructs all together form the block.

A construct is any line of code which changes or controls changes of the value of an object (i.e. next_state=Start), or checks for a specific condition (i.e. If next_state=Reset then A=0). Any other line of code containing a recognized computer command is also defined as a construct.

An arc is a section of code which links two blocks of code together.

An FSM state is a stable logic and register configuration in a circuit design. FSM states include a plurality of blocks and arcs.

An FSM transition is an arc which connects two FSM states. An FSM transition is formed by one or more arcs, going through one or more blocks, causing the FSM to change states.

As the circuit design's various blocks or states are entered and respective arcs or transition are followed, the map in coverage database 104 is updated. The map identifies those blocks, states, arcs and transitions which have been exercised/tested. The coverage database 104 is coupled to the coverage analysis tool 110, which is coupled to, and uses output data from, simulated, design 112 to determine which areas of the circuit design have been tested. Based upon this information coverage analysis tool 110 then updates coverage database 104. Coverage analysis tools are well known in the art.

Test generator 106 receives data from design database 102 and coverage database 104, and in response generates a set of test vectors which are sent to simulated design 112. The simulated design 112 in response generates output data which is sent to both coverage analysis tool 110 and output log database 114. The simulated design 112 includes software (such as Verilog or VHDL) which is executed by a computer (not shown) to model the operational characteristics of the circuit design. The output log database 114 stores the output data from the simulated design 112 for later analysis by other EDA tools (not shown). The test bench 108 which executes the simulated design 112 is well known in the art.

Before it generates the test vectors, the test generator 106 completely checks the syntax and synthesizability of the circuit design in the design database 102 which is to be tested. The test generator 106 indicates whether there are any syntax errors in the circuit design, and whether all parts of the design are synthesizable. The test generator 106 then expands any macros and data structures in the design description. Next, the test generator 106 analyzes the design description and identifies all inputs and outputs. The test generator 106 interprets the design description as a plurality of basic-blocks and complex-blocks connected by arcs and as a plurality of FSMs connected by transitions. From this analysis, a decision tree can be created. The test generator 106 then verifies the testability of each block in the circuit design, independent of all other blocks. A basic-block is the smallest building block in a design description. Basic-blocks are equivalent to constructs, and are defined as where either a condition is met or a calculation occurs. Basic-blocks grouped together form a complex-block.

A set of consecutive arcs defines a path. A typical design description has a very large number of paths. However, only a limited number of paths may be of interest to users. These are defined as paths-of-interest.

For example, the following design description contains four basic-blocks:

| If (a < b) then | $1^{st}$ basic-block/construct |
| c = a - b | $2^{nd}$ basic-block/construct |
| else c = b - a endif | $3^{rd}$ basic-block/construct |
| result = c * 3 | $4^{th}$ basic-block/construct |

In the above example, arcs are defined between the $1^{st}$ basic-block and the $2^{nd}$ basic-block, the $1^{st}$ basic-block and the $3^{rd}$ basic-block, the $2^{nd}$ basic-block and the $4^{th}$ basic-block, and the $3^{rd}$ basic-block and the $4^{th}$ basic-block. Paths are defined from the $1^{st}$ basic-block through the $2^{nd}$ basic-block to the $4^{th}$ basic-block, and from the $1^{st}$ basic-block through the $3^{rd}$ basic-block to the $4^{th}$ basic-block.

The test generator 106 preferably tests the blocks, arcs, FSM states, and FSM transitions at various levels of granularity. Thus test vectors can be generated to exercise either top-level inputs and outputs, individual FSM states and transitions, various paths-of-interest, complex-blocks, and basic blocks and arcs. The test generator 106 creates a test vector by first determining which input, output, FSM, path, block, or arc element is to be tested next. The test generator 106 then determines what variables (also called "objects") need to be set or what conditions need to occur so that the simulated design 112 transitions from a currently active block to the untested element. This process is called "back-solving." The test generator 106 can also use a "forward solving" approach to decide what sequence of actions to take in order to activate the untested elements. In general, the test generator 106 preferably generates test vectors which exercise the greatest number of the untested elements.

An active-block is a block which is waiting for some variable to be set or condition to occur before the block passes control to a next block. A common type of condition is a timing constraint, which is when a variable needs to be set to a predetermined state in a predetermined number of clock pulses of another variable transitioning to a different state. Other conditions, such as variables being set to a predetermined value, are also common.

A complete set of test vectors is called a test frame. Test frames are routed to test bench 108 where simulated design 112 can be stimulated by the test vectors. In response, a set of output data is generated by simulated design 112 and stored in output log database 114 and coverage analysis tool 110.

Test generator 106 then scans coverage database 104 for any blocks, arcs, FSM states, FSM transitions, or paths-of-interest that have not been exercised by the test vectors. Test generator 106 then generates additional test vectors for exercising those as-yet untested elements using either the back-solving or forward-solving techniques.

During the course of this iterative process, test generator 106 uses the data in coverage database 104 to determine whether simulated design 112 is stable over a predetermined period of time for all given inputs. Test generator 106 also records whether simulated design 112 contains any un-reachable FSM states or blocks, and any un-exercisable transitions or arcs.

Figure 2:
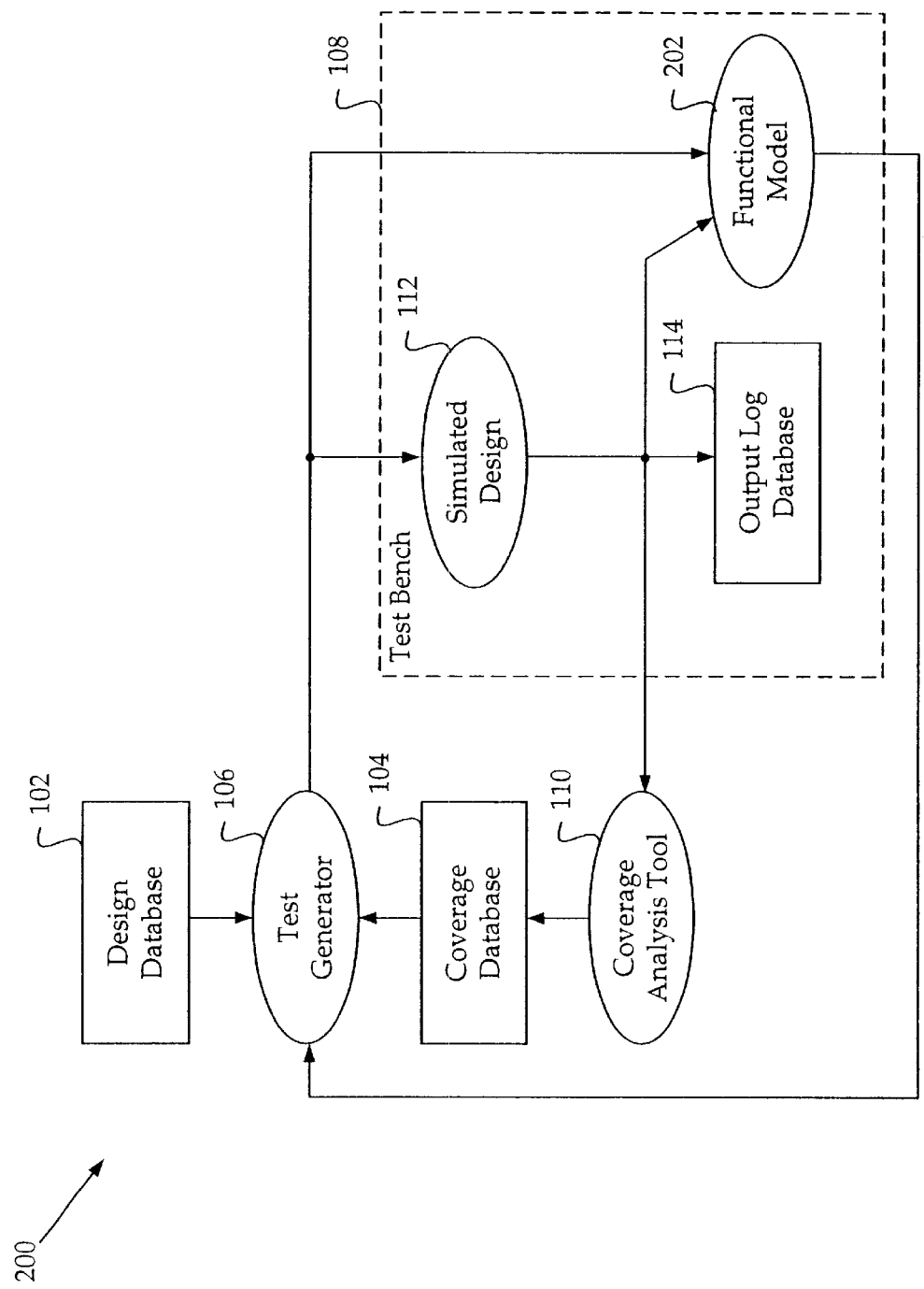
FIG. 2 is a data-flow diagram of a second embodiment of the invention for identifying finite state machines and verifying circuit designs.

FIG. 2 is a data-flow diagram of a second exemplary system 200 for finite state machine identification and circuit design verification according to the present invention. In addition to the elements introduced in FIG. 1, the second system 200 includes a functional model 202, which is coupled to receive test vectors from the test generator 106, output data from the simulated design 112, and verify the output data's accuracy. Functional model 202 compares the output data from simulated design 112 with a set of expected values generated by functional model 202. These expected values are intended to reflect how the design description should operate in response to the test vectors generated by test generator 106. Functional model 202 labels the output data from simulated design 112 as either correct or incorrect. Functional model 202 also flags indeterminate conditions, such as when the simulated design 112 does not generate any output data in response to a test vector.

Functional model 202 is a non-cycle-accurate model of simulated design 112. A non-cycle-accurate model is one that does not attempt to mimic simulated design 112 during each cycle of the simulation. Functional model 202 can generate a set of expected values in one of several ways. For instance, functional model 202 can be implemented as a database lookup table or as an algorithm. For example, while the simulated design may be comprised of a set of commands for defining a series of AND and OR gates interconnected with latches and registers, which together implement a multiplication function, functional model 202 could simply perform a logical multiplication with a program written in a conventional programming language.

Test generator 106 is coupled to receive the results generated by functional model 202, thus creating a second feedback loop in system 200. Test generator 106 correlates the test vectors sent to simulated design 112 with the results from functional model 202 to localize and identify which of the top-level inputs and outputs, individual FSM states and transitions, various paths-of-interest, complex-blocks, and basic blocks and arcs in simulated design 112 operate incorrectly or indeterminately. Test generator 106 can then be programmed to automatically generate a more detailed series of tests focused on the incorrect or indeterminate design elements. Alternatively, test generator 106 only prints out the set of test results which a designer then uses to manually generate a more detailed series of tests.

Figure 3:
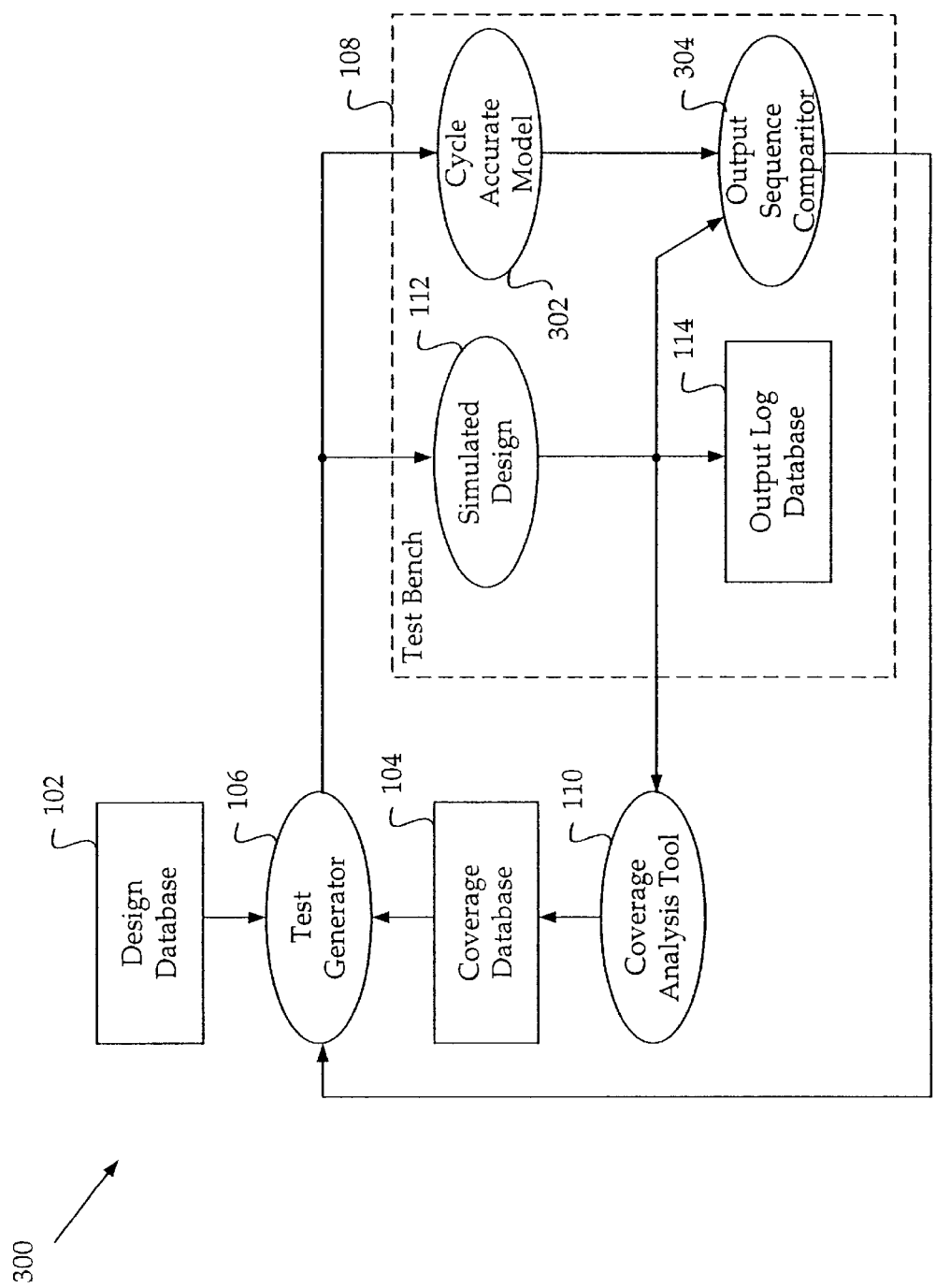
FIG. 3 is a data-flow diagram of a third embodiment of the invention for identifying finite state machines and verifying circuit designs.

FIG. 3 is a data-flow diagram of a third exemplary system 300 for finite state machine identification and circuit design verification according to the present invention. In addition to the elements introduced in FIG. 1, the third system 300 includes a cycle accurate model 302 and an output sequence comparator 304. Cycle accurate model 302 is coupled to receive the test vectors from test generator 106 and is designed to match cycle-for-cycle the output data from simulated design 112. Output sequence comparator 304 is coupled to receive output data from both simulated design 112 and cycle accurate model 302. Output sequence comparator 304 compares every cycle of the output data and generates a set of results which labels the output data from simulated design 112 as either correct, incorrect, or indeterminate.

Test generator 106 is coupled to receive the results generated by output sequence comparator 304, thus creating a second feedback loop in the system 300. Test generator 106 then correlates the test vectors sent to simulated design 112 with the results from output sequence comparator 304 to localize and identify whether the top-level inputs and outputs, individual FSM states and transitions, various paths-of-interest, complex-blocks, and basic blocks and arcs in simulated design 112 are operating incorrectly or indeterminately. Test generator 106 is then programmed to either automatically generate a more detailed series of tests which center about any incorrect or indeterminate design elements, or to print out the results for a designer to review.

Test generator 106, coverage analysis tool 110, simulated design 112, functional model 202, cycle accurate model 302, and output sequence comparator 304 are software modules comprised of computer program instructions that run on a computer (not shown). The computer includes a processing unit and a memory. The memory stores computer program instructions for controlling how the processing unit accesses, transforms and outputs data. Those skilled in the art will recognize that the internal memory can be supplemented with other computer useable storage media.

Figure 4:
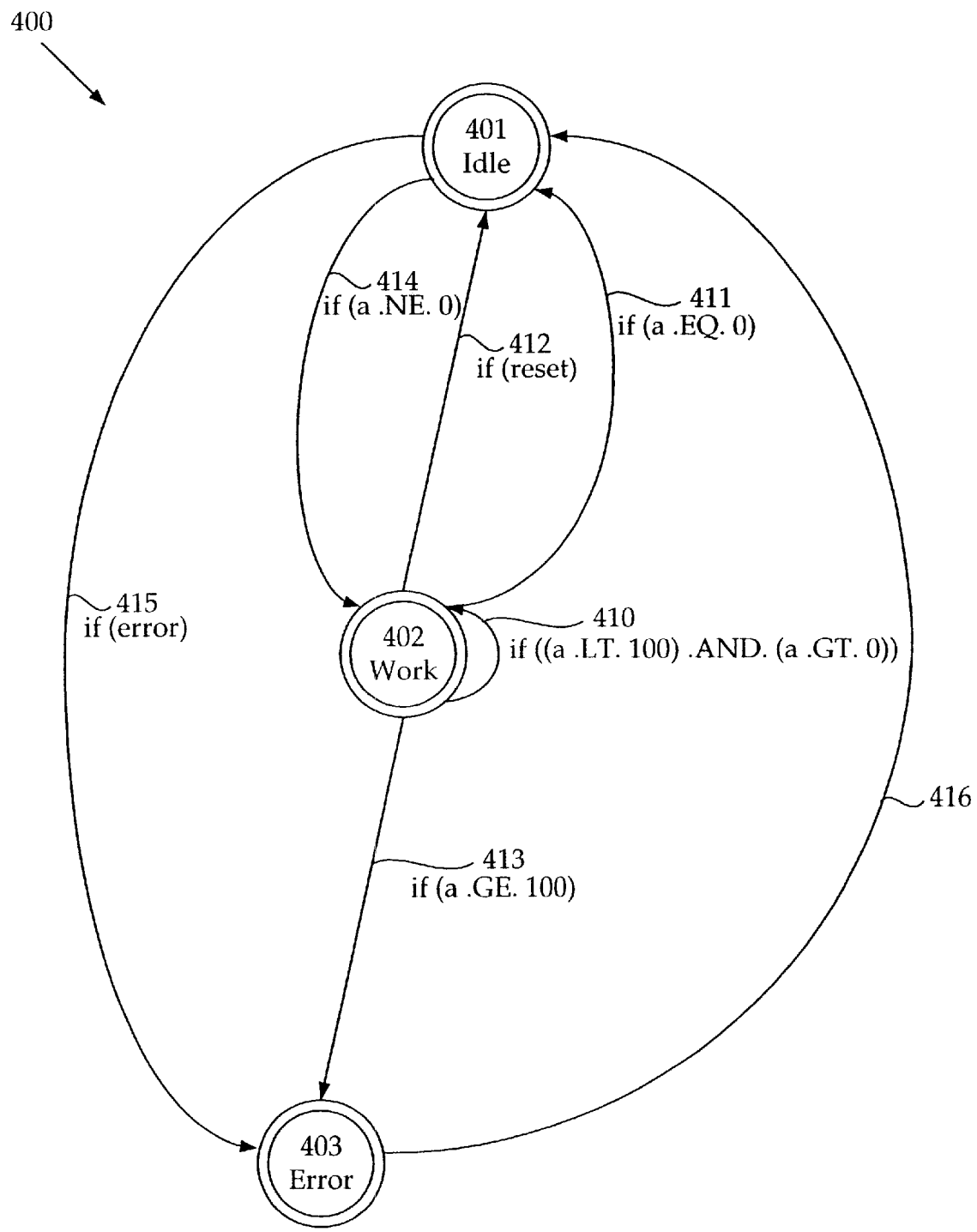
FIG. 4 is a diagram of an exemplary circuit design 400 tested using the present invention.

FIG. 4 is a diagram of an exemplary circuit design 400 tested using the present invention. The following discussion illustrates how test generator 106 produces a set of test vectors to test the circuit design and how the test generator responds to the test results. Each state in the exemplary circuit design is made of one or more blocks, and internal arcs which perform functions of that state and calculate a next state.

To begin, test generator 106 identifies various states and transitions in the design. Circuit design 400 has three states: 401, 402 and 403, and six transitions: 410, 411, 412, 413, 414, 415 and 416. Transition 410 is a "self" arc from state 402 back to state 402. This transition is taken until all "Work" in state 402 is completed. Transitions 411 and 412 both go from state 402 to state 401. In this example, transition 411 is taken when "Work" is completed and transition 412 is taken when a reset signal is asserted. Transition 413 is taken when an error is signaled from state 402 to state 403. Transition 414 is taken when new "Work" arrives from state 401 to state 402. Transition 415 is taken when an error is signaled in state 401 to state 403. Transition 416 is taken after an error has been handled from state 403 to state 401.

Test generator 106 generates test vectors which set variables so that each FSM state, FSM transition, block, arc, and path of interest in the exemplary circuit design is tested. Test generator 106 also accepts pre-determined paths of interest as input from a user. Test generator 106 can be pre-programmed with assertions which instruct the test generator to generate an alert upon the occurrence of certain conditions.

Figure 5:
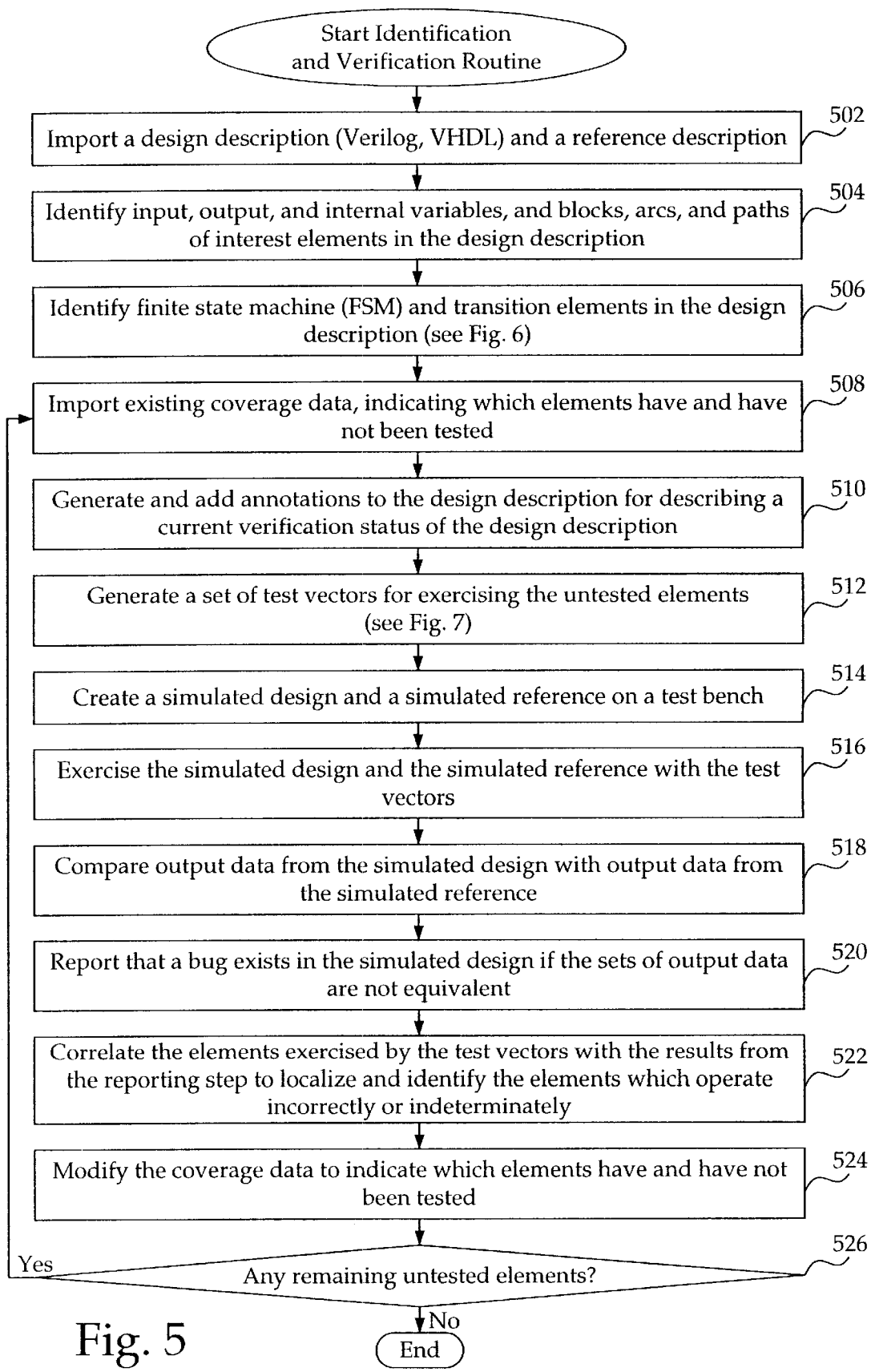
FIG. 5 is a flowchart of steps in a method for identifying finite state machines and verifying circuit designs.

FIG. 5 is a flowchart of a method for identifying finite state machines and verifying circuit designs. The method begins in step 502 where test generator 106 imports a design description (typically in a hardware description language such as Verilog or VHDL) from design database 102, and test bench 108 imports a reference description from another database (not shown). The reference description optionally forms the basis of either the functional model 202 or the cycle accurate model 302. In step 504 test generator 106 identifies input, output, and internal variables, and blocks, arcs, and paths of interest elements in the design description. In step 506 test generator 106 identifies FSMs and transitions elements in the design description. Step 506 is detailed in FIG. 6. In step 508 test generator 106 imports existing coverage data, indicating which elements have and have not been tested, from coverage database 104. In step 510, test generator 106 generates and adds to the design description annotations for describing a current verification status of the design description. In step 512 test generator 106 generates a set of test vectors for exercising the untested elements. Step 512 is detailed in FIG. 7. In step 514 test generator 106 creates the simulated design 112 and a simulated reference on test bench 108. The simulated reference is equivalent to a first portion of the functional model 202, or alternatively to the cycle accurate model 302. In step 516, test generator 106 transmits the test vectors to the test bench 108 for exercising the simulated design 112 and the simulated reference. In step 518, a second portion of functional model 202, or alternatively of output sequence comparator 304, compares output data from both.the simulated design and the simulated reference. In step 520 if the output data sets are not equivalent the second portion of functional model 202 (or of output sequence comparator 304) reports that a bug exists in simulated design 112. In step 522 the test generator 106 correlates the elements exercised by the test vectors with the results from the reporting step 520 to localize and identify the elements in the simulated design which operate incorrectly or indeterminately. In step 524 coverage analysis tool 110 modifies the coverage data to indicate which elements in simulated design 112 have not been tested. In step 526 if any elements remain to be tested the process returns to step 508, otherwise the process ends.

Figure 6:
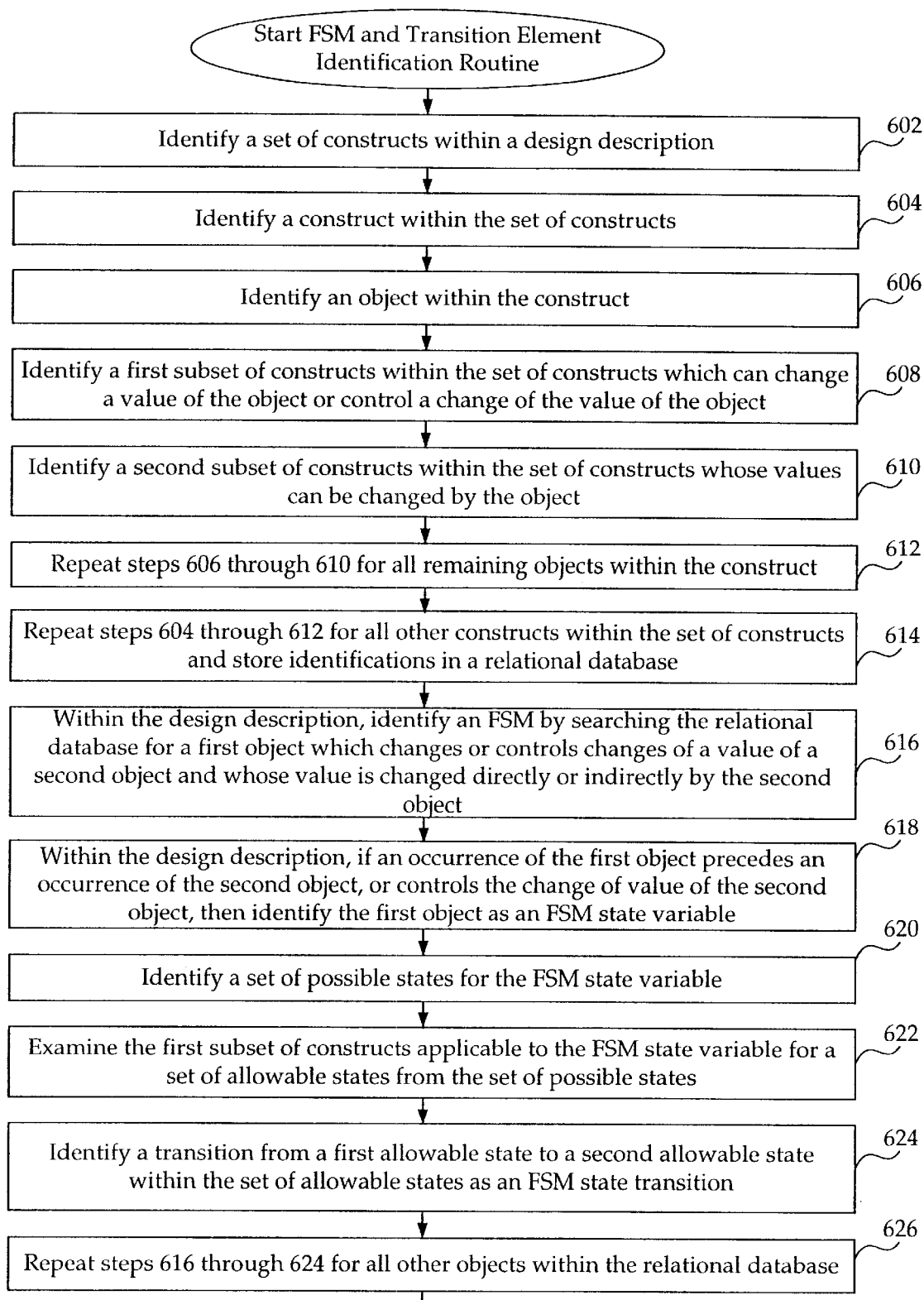
FIG. 6 is a flowchart of steps in a method for identifying finite state machine and transition elements in a design description.

FIG. 6 is a flowchart of a method for identifying finite state machine and transition elements in the design description (step 506 of FIG. 5). The method begins in step 602 where test generator 106 identifies a set of constructs in a design description in design database 102. Step 604 identifies a construct in the set of constructs. Step 606 identifies an object in the construct. Step 608 identifies a first subset of constructs in the set of constructs which can change, or control a change of, a value of the object. Step 610 identifies a second subset of constructs in the set of constructs whose values can be changed directly or indirectly by the object. Step 612 repeats steps 606 through 610 for all remaining objects in the construct. Step 614 repeats steps 604 through 612 for all remaining constructs in the set of constructs, and stores the identifications in a relational database. Step 616 identifies an FSM in the design description by searching the relational database for a first object which changes or controls changes of a value of a second object, and whose value is changed directly or indirectly by the second object. In step 618, if an occurrence of the first object precedes an occurrence of the second object, or controls the change of the value of the second object in the design description, then the first object is identified as an FSM state variable. Step 620 identifies a set of possible states for the FSM state variable. In step 622, the first subset of constructs applicable to the FSM state variable is examined for a set of allowable states from the set of possible states. Next, in step 624, a transition from a first allowable state to a second allowable state in the set of allowable states is identified as an FSM state transition. Step 626 repeats steps 616 through 624 for all other objects in the relational database. The method then ends.

Figure 7:
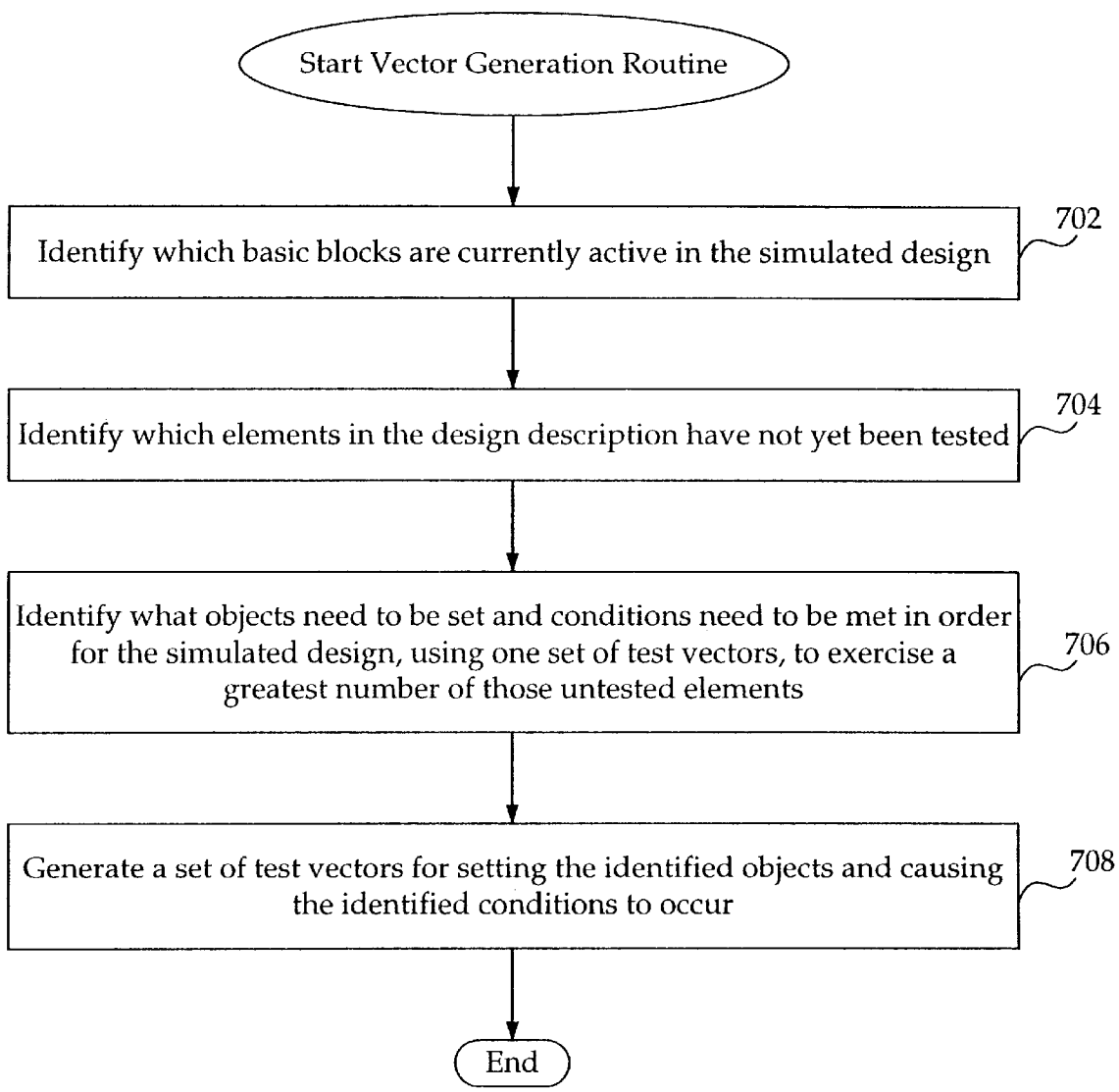
FIG. 7 is a flowchart of steps in a method for generating a set of test vectors.

FIG. 7 is a flowchart of steps in a method for generating a set of test vectors (step 512 of FIG. 5). First, in step 702, test generator 106 identifies which blocks are currently active in the simulated design description. The system continuously tracks the flow of control and data throughout the simulated system to maintain a database of active blocks. Then, in step 704, test generator 106 accesses coverage database 104 to identify which elements have not yet been tested. In step 706, test generator 106 identifies what objects need to be set and what conditions need to occur for the simulated design 112, using one set of test vectors, to exercise a greatest number of those untested elements. In step 708, the test generator 106 generates a set of test vectors for setting the identified objects and for causing the identified conditions to occur. After step 708, the method for generating a set of test vectors ends.

While the present invention has been described with reference to a preferred embodiment, those skilled in the art will recognize that various modifications may be made, and that the present invention is limited only by the following claims.

What is claimed is:

1. A method for identifying a finite state machine (FSM) and verifying a circuit design in a design description, comprising the steps of:
   automatically identifying a FSM element in the description;
   wherein said automatically identifying step identifies a FSM by finding in the description a first object which changes or controls a change of a value of a second object and whose value is also changed directly or indirectly by the second object;
   importing coverage data which lists an untested element; and
   generating a test vector for stimulating the untested element.

2. The method of claim 1 wherein the automatically identifying step comprises searching a relational database for the first object and the second object.

3. The method of claim 2 wherein the searching step comprises:
   identifying a set of constructs in the -design description;
   identifying a construct in the set of constructs;
   identifying an object in the construct;
   identifying a first subset of constructs in the set of constructs which can control a change of a value of the object; and
   storing the identified construct, object, and first subset of constructs in the relational database.

4. The method of claim 3 wherein the searching step further comprises:
   identifying a second subset of constructs in the set of constructs whose values can be changed by the object; and
   storing the second subset of constructs in the relational database.

5. The method of claim 4 wherein the searching step further comprises repeating the identifying and storing steps in the searching step for all other objects in the construct.

6. The method of claim 5 wherein the searching step further comprises repeating the steps of identifying, storing, and repeating steps for all other constructs in the set of constructs.

7. The method of claim 2 further comprising the step of identifying the first object as a FSM state variable if an occurrence of the first object precedes an occurrence of the second object in the design description.

8. The method of claim 2 further comprising the step of identifying the second object as a FSM state variable if an occurrence of the second object precedes an occurrence of the first object in the design description.

9. The method of claim 7 further comprising the step of identifying a set of allowable states for the FSM state variable.

10. The method of claim 9 further comprising the step of identifying as an FSM state transition element a transition from a first allowable state to a second allowable state in the set of allowable states.

11. A system for identifying a finite state machine (FSM) and verifying a circuit design, in a design description, comprising:
    means for automatically identifying a FSM element in the design description;
    wherein said means for automatically identifying identifies a FSM by finding in the design description a first object which changes or controls a change of a value of a second object and whose value is also changed directly or indirectly by the second object;
    means for importing coverage data which lists an untested element; and
    means for generating a test vector for stimulating the untested element.

12. The system of claim 11 wherein the means for automatically identifying comprises means for searching a relational database for the first object and the second object.

13. The system of claim 12 wherein the means for searching comprises:
    means for identifying a set of constructs in the design description;
    means for identifying a construct in the set of constructs;
    means for identifying an object in the construct;
    means for identifying a first subset of constructs in the set of constructs which can control a change of a value of the object; and
    means for storing the identified construct, object, and first subset of constructs in the relational database.

14. The system of claim 13 wherein the means for searching further comprises:
    means for identifying a second subset of constructs in the set of constructs whose values can be changed by the object; and
    means for storing the second subset of constructs in the relational database.

15. The system of claim 14 wherein the means for searching further comprises means for repeating the means for identifying and storing in the means for searching for all objects in the construct.

16. The system of claim 15 wherein the means for searching further comprises means for repeating the means for identifying, storing, and repeating in the means for searching for all constructs in the set of constructs.

17. The system of claim 12 further comprising means for identifying the first object as a FSM state variable if an occurrence of the first object precedes an occurrence of the second object in the design description.

18. The system of claim 12 further comprising means for identifying the second object as a FSM state variable if an occurrence of the second object precedes an occurrence of the first object in the design description.

19. The system of claim 17 further comprising means for identifying a set of allowable states for the FSM state variable.

20. The system of claim 19 further comprising means for identifying as a FSM state transition element a transition from a first allowable state to a second allowable state in the set of allowable states.

21. A computer-readable medium embodying computer program code for causing the computer to identify a finite state machine and verify a circuit design, by performing the steps of:

automatically, identifying a finite state machine (FSM) element in a design description;

wherein said automatically identifying step identifies a FSM by fin,ding in the design description a first object which changes or controls a change of a value of a second object and whose value is also changed directly or indirectly by the second object;

importing coverage data which lists an untested element; and generating a test vector for stimulating the untested element.

22. The computer-useable medium of claim 21 wherein the automatically identifying step comprises searching a relational database for the first object and the second object.

23. The computer-useable medium of claim 22 wherein the searching step further comprises the steps of:

identifying a set of constructs in the design description;

identifying a construct in the set of constructs;

identifying an object in the construct;

identifying a first subset of constructs in the set of constructs which can control a change of a value of the object; and storing the identified construct, object, and first subset of constructs in the relational database.

24. The computer-useable medium of claim 23 wherein the searching step further comprises the steps of:

identifying a second subset of constructs in the set of constructs whose values can be changed by the object; and storing the second subset of constructs in the relational database.

25. The computer-readable medium of claim 24 wherein the searching step further comprises repeating the steps of identifying and storing for all other objects in the construct.

26. The computer-readable medium of claim 25 wherein the searching step further comprises repeating the steps of identifying and storing for all constructs in the set of constructs.

27. The computer medium of claim 22 further comprising the step of identifying the first object as a FSM state variable if an occurrence of the first object precedes an occurrence of the second object in the design description.

28. The computer medium of claim 22 further comprising the step of identifying the second object as a FSM state variable if an occurrence of the second object precedes an occurrence of the first object in the design description.

29. The computer medium of claim 27 further comprising the steps of identifying a set of allowable states for the FSM state variable.

30. The computer medium of claim 29 further comprising the step of identifying a transition between a first allowable state to a second allowable state in the set of allowable states as a FSM state transition element.

31. A system for identifying a finite state machine and verifying a circuit design, comprising:

a design database for storing a design description;

a test bench, coupled to the design database, for generating a simulated design based on the design description;

a coverage analysis tool, coupled to receive output data from the test bench, for identifying untested elements in the simulated design; and a test generator coupled to the design database, the test bench, and the coverage analysis tool, for identifying a finite state machine element in the design description by identifying finite state machine variables in the design description, and generating and sending test vectors to the test bench for exercising the untested elements of the simulated design.

* * * * *